United States Patent [19]
Okamoto et al.

[11] Patent Number: 6,028,335
[45] Date of Patent: Feb. 22, 2000

[54] SEMICONDUCTOR DEVICE

[75] Inventors: Yuji Okamoto; Norio Funahashi, both of Kanagawa, Japan

[73] Assignee: NEC Corporation, Tokyo, Japan

[21] Appl. No.: 09/064,866

[22] Filed: Apr. 22, 1998

[30] Foreign Application Priority Data

Apr. 23, 1997 [JP] Japan .................................. 9-105779

[51] Int. Cl.$^7$ .................................................. H01L 31/00
[52] U.S. Cl. .......................... 257/314; 257/315; 257/323; 257/435; 257/443; 257/458; 257/461
[58] Field of Search .................................. 257/314, 443, 257/435, 461, 458, 315, 323

[56] References Cited

U.S. PATENT DOCUMENTS

| | | | |
|---|---|---|---|
| 4,935,702 | 6/1990 | Mead et al. | 330/9 |
| 5,070,378 | 12/1991 | Yamagata et al. | 357/23.5 |
| 5,592,004 | 1/1997 | Tamura et al. | 257/323 |
| 5,656,521 | 8/1997 | Hamilton et al. | 438/4 |
| 5,737,281 | 4/1998 | Takeda et al. | 369/14 |

FOREIGN PATENT DOCUMENTS

| | | |
|---|---|---|
| 4-6421 | 1/1992 | Japan . |
| 4-138137 | 5/1992 | Japan . |
| 5-38915 | 5/1993 | Japan . |

*Primary Examiner*—William Mintel
*Attorney, Agent, or Firm*—Foley, Hoag & Eliot LLP

[57] ABSTRACT

A semiconductor device includes first and second elements, a light-shielding member, and a comparator. The first and second elements are formed on the same substrate, change in electrical characteristics upon irradiation of ultraviolet rays, and hold the changed states. The first element has the same arrangement as that of the second element. The light-shielding member is formed on the first element to shield ultraviolet rays. The comparator compares the electrical characteristics of the first and second elements and outputs an abnormality detection signal on the basis of the comparison results.

20 Claims, 4 Drawing Sheets

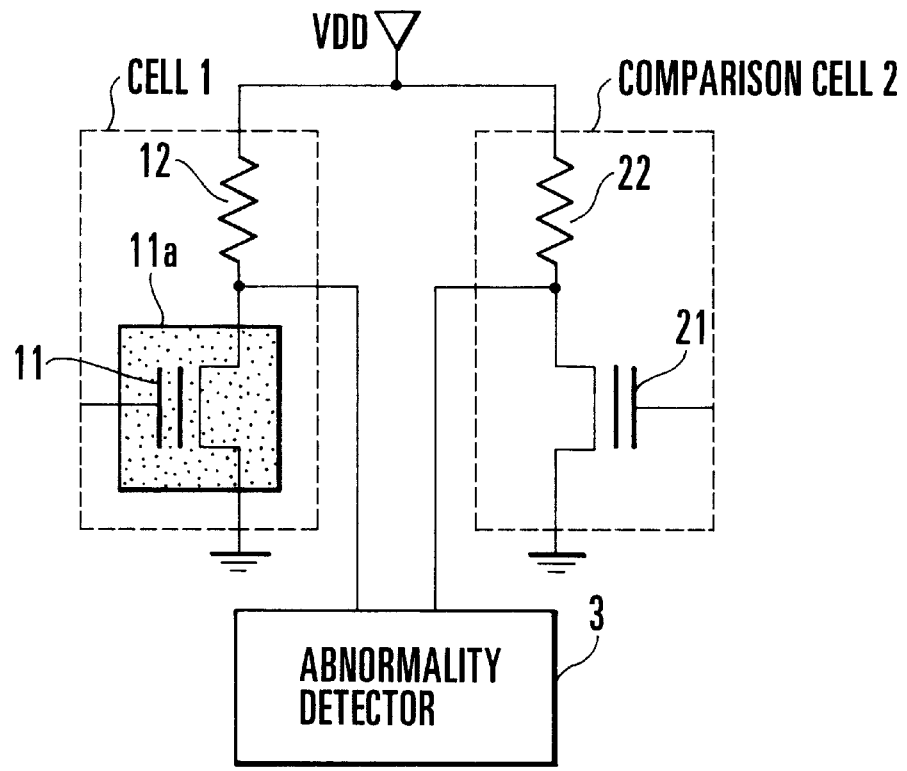
F I G. 1A
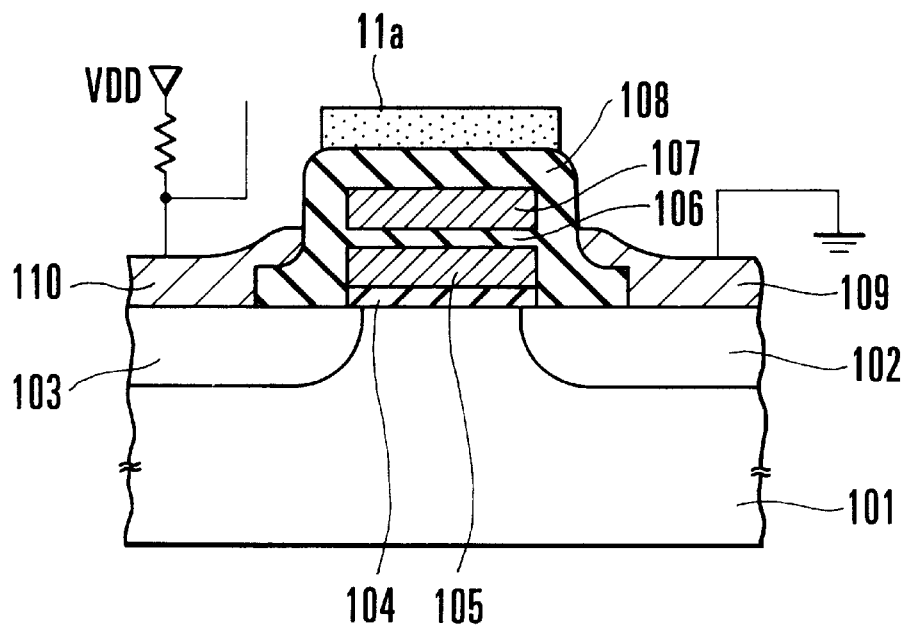
F I G. 1B

SEMICONDUCTOR DEVICE

BACKGROUND OF THE INVENTION

The present invention relates to a semiconductor device having an ultraviolet detecting section for detecting irradiation of ultraviolet rays.

At present, electrically erasable programmable read only memories (EEPROMs) are being used as general external memory devices in portable computers giving importance to communication functions. The EEPROM is advantageous in that data can be electrically written/erased in/from individual memory cells. However, data stored in the EEPROM is naturally erased by irradiation of ultraviolet rays.

For this reason, as disclosed in Japanese Utility Model Laid-Open No. 5-38915, a light-shielding film is conventionally formed on an EEPROM cell to shield ultraviolet rays which causes a data erase.

Since the light-shielding film is conventionally formed on the EEPROM cell, the semiconductor device operates even if the light-shielding film is damaged so that the EEPROM cell is irradiated with ultraviolet rays. In this case, no operation abnormality is detected though data of some cells are unintentionally erased. The semiconductor device having a defective EEPROM in which some of stored data become abnormal is undesirably used.

When such an EEPROM is used as an external memory device of a computer, the computer may run away owing to destroyed data.

SUMMARY OF THE INVENTION

It is an object of the present invention to provide a semiconductor device which is made up of an element whose characteristics change under the influence of ultraviolet rays and the like, and can detect irradiation of ultraviolet rays to the element whose characteristics are changed by ultraviolet rays.

In order to achieve the above object, according to the present invention, there is provided a semiconductor device comprising first and second elements which are formed on the same substrate, change in electrical characteristics upon irradiation of ultraviolet rays, and hold changed states, the first element having the same arrangement as an arrangement of the second element, a light-shielding member formed on the first element to shield ultraviolet rays, and comparing means for comparing the electrical characteristics of the first and second elements and outputting an abnormality detection signal on the basis of a comparison result.

BRIEF DESCRIPTION OF THE DRAWINGS

FIG. 1A is a diagram showing the schematic arrangement of a semiconductor device according to the first embodiment of the present invention;

FIG. 1B is a sectional view of the main part of a memory element shown in FIG. 1A;

DESCRIPTION OF THE PREFERRED EMBODIMENTS

Figure 2:
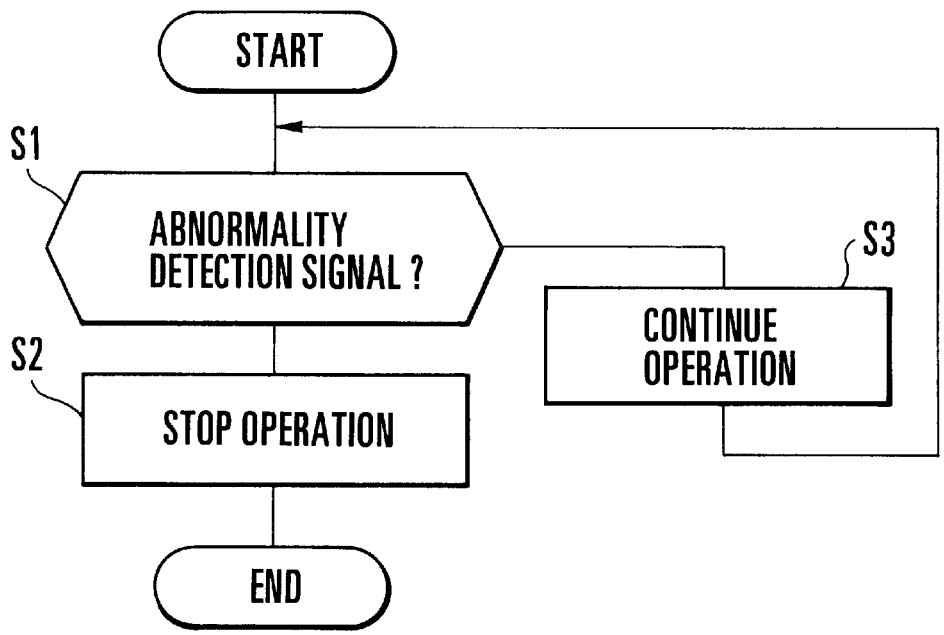
FIG. 2 is a flow chart for explaining the operation of the semiconductor device shown in FIG. 1A.

The present invention will be described in detail below with reference to the accompanying drawings.

FIGS. 1A and 1B schematically show a semiconductor device according to the first embodiment of the present invention. As shown in FIG. 1A, the semiconductor device of the first embodiment comprises a cell 1 and a comparison cell 2 which are formed on a semiconductor substrate (to be described later), and a detector 3. The comparison cell 2 and the detector 3 constitute an ultraviolet detecting section. The cell 1 is made up of a memory element 11 and a resistor 12 connected to the drain of the memory element 11. As shown in FIG. 1B, an aluminum light-shielding member 11a for shielding or reducing ultraviolet rays is formed on the memory element 11. The comparison cell 2 is made up of a comparison memory element 21 and a resistor 22 connected to the drain of the comparison memory element 21.

The abnormality detector 3 compares a signal at the connection point between the memory element 11 and one terminal of the resistor 12 with a signal at the connection point between the comparison memory element 21 and one terminal of the resistor 22. When the difference between the signals becomes a predetermined value or more, the abnormality detector 3 determines an abnormality and outputs an abnormality detection signal. Note that the other terminal of each of the resistors 21 and 22 is connected to a power supply, and the sources of the memory element 11 and the comparison memory element 21 are grounded.

This semiconductor device further comprises an EEPROM and the like although not shown. Upon reception of the abnormality detection signal from the abnormality detector 3, the operation of the EEPROM stops.

The structure of the memory element 11 will be explained with reference to FIG. 1B.

A source 102 and a drain 103 doped with an n-type impurity are formed in a p-type semiconductor substrate 101 at a predetermined interval. A floating gate 105 electrically insulated from surroundings is formed through a gate insulating film 104 in a region sandwiched between the source 102 and the drain 103. A control gate 107 is formed on the floating gate 105 through an insulating film 106. The floating gate 105 and the control gate 107 are made of heavily doped polysilicon.

As described above, the memory element 11 of the first embodiment is formed such that the light-shielding member 11a covers the entire floating gate 105 through an insulating film 108 on the control gate 107. A source electrode 109 ohmic-contacts the source 102, and a drain electrode 110 ohmic-contacts the drain 103.

The comparison memory element 21 has substantially the same structure as that of the memory element 11. The comparison memory element 21 is different from the memory element 11 only by the absence of the light-shielding member 11a. That is, the memory element 11 and the comparison memory element 21 have the same diffusion density in the source and drain, the same gate length, the same gate width, and the like.

In the memory element 11 and the comparison memory element 21, if no electron is accumulated in the floating gate 105, a current flows through the source 102 and the drain 103 upon application of the gate voltage to the control gate 107. If electrons are accumulated in the floating gate 105, a channel is hardly induced between the source 102 and the drain 103 owing to the negative charges of the electrons in the floating gate 105. In this state, the threshold voltage increases, and no current flows through the source 102 and the drain 103 even upon application of the same gate voltage to the control gate 107.

The state wherein electrons are accumulated in the floating gate 105 can be formed by applying a high voltage of, e.g., 10 to 20 V across the control gate 107 and the drain 103. More specifically, when a high voltage is applied across the control gate 107 and the drain 103, electrons traveling through a channel cause avalanche breakdown under a high electric field at the end of the drain 103. Some of high-energy electrons produced at this time pass over a potential barrier formed by the gate insulating film 104, are injected into the conduction band of the gate insulating film 104, and move to the floating gate 105 by an electric field generated by capacitive coupling between the drain 103, the floating gate 105, and the source 102.

The electrons accumulated in the floating gate 105 are changed into hot carriers by irradiation of ultraviolet rays. The hot carriers escape to the semiconductor substrate 101 and the control gate 107 through the upper and lower insulating films 104 and 106.

The operation of detecting irradiation of ultraviolet rays will be explained.

In the ultraviolet detecting section shown in FIG. 1A, electrons are accumulated in the floating gates 105 of the memory element 11 and the comparison memory element 21 in an initial state. In this state, the threshold voltage is high in both the memory element 11 and the comparison memory element 21, as described above. In the abnormality detector 3, therefore, the voltage of an input signal from the cell 1 is equal to the voltage of an input signal from the comparison cell 2.

In this state, when the cell 1 and the comparison cell 2 are irradiated with ultraviolet rays, only the floating gate 105 of the comparison memory element 21 is irradiated with ultraviolet rays. Then, the electrons accumulated in the floating gate 105 of the comparison memory element 21 decrease, and the threshold voltage decreases in the comparison memory element 21, as described above. As a result, in the abnormality detector 3, the voltage of an input signal from the cell 1 becomes different from the voltage of an input signal from the comparison cell 2.

When the voltage difference between the two input signals becomes a predetermined value or more, the abnormality detector 3 determines an abnormality and outputs an abnormality detection signal. In other words, in the semiconductor device of the first embodiment, the abnormality detector 3 outputs an abnormality detection signal in response to irradiation of ultraviolet rays. By monitoring the presence/absence of the abnormality detection signal from the abnormality detector 3, irradiation of ultraviolet rays can be detected.

FIG. 2 shows the operation of the semiconductor device having the above arrangement. Referring to FIG. 2, whether an abnormality detection signal is output from the abnormality detector 3 is checked in step S1. If YES in step S1, the flow shifts to step S2 to stop the operation. If NO in step S1, the flow shifts to step S3 to continuously perform the operation for a predetermined time. After the lapse of the predetermined time, the flow returns to step S1 to repeatedly execute the above operation.

In the above-described operation, the operation of the semiconductor device is stopped in accordance with the output of an abnormality detection signal, but the present invention is not limited to this. For example, normal data may be rewritten in the EEPROM of the semiconductor device upon the output of an abnormality detection signal.

Figure 3:
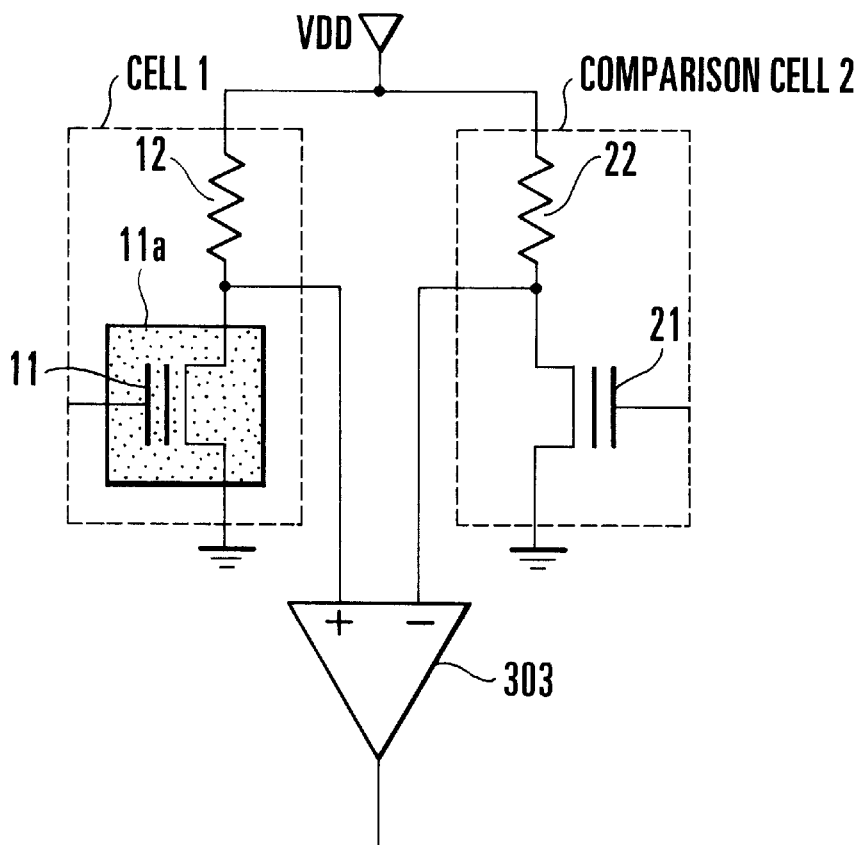
FIG. 3 is a diagram showing the schematic arrangement of a semiconductor device according to the second embodiment of the present invention.

FIG. 3 schematically shows a semiconductor device according to the second embodiment of the present invention.

In the second embodiment, as shown in FIG. 3, a comparator 303 made up of an operational amplifier replaces the abnormality detector 3 shown in FIG. 1A, and the remaining arrangement is the same as in FIG. 1A.

Figure 4:
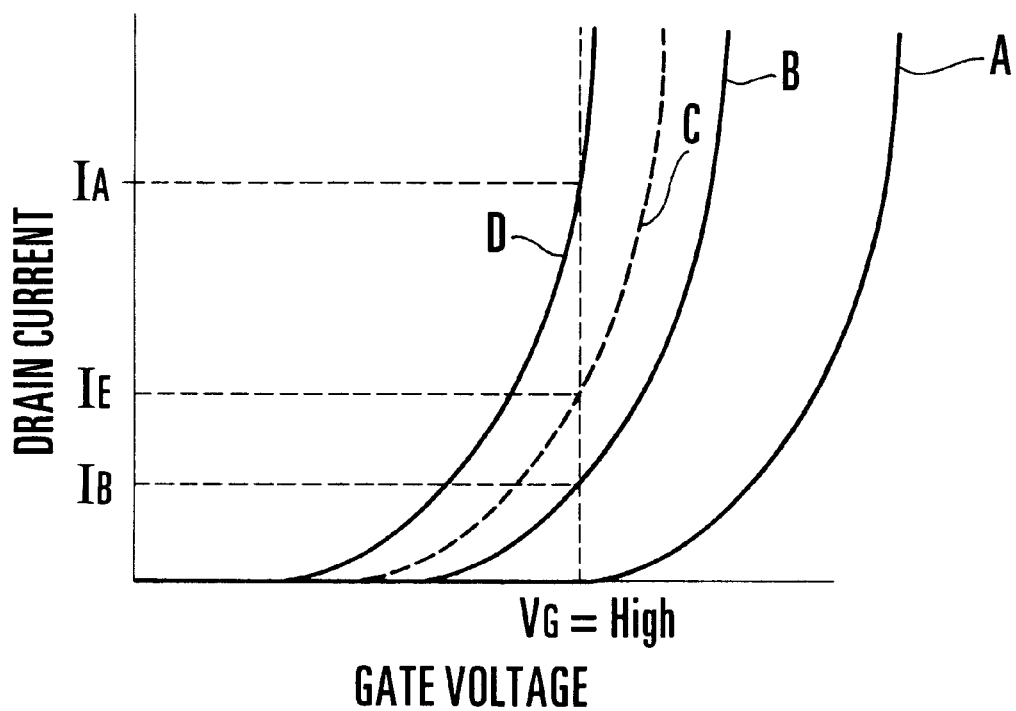
FIG. 4 is a graph showing the characteristics of the memory element.

The operation of detecting ultraviolet rays in the semiconductor device having this arrangement will be explained. In a memory element 11 and a comparison memory element 21, a high voltage of, e.g., 10 to 20 V is applied across a control gate 107 and a drain 103. Then, electrons are accumulated in floating gates 105 of the memory element 11 and the comparison memory element 21, and the memory element 11 and the comparison memory element 21 change to the state of characteristic A shown in FIG. 4. That is, the source and drain are kept nonconductive even upon application of a gate voltage $V_G$="High".

When the semiconductor device is irradiated with ultraviolet rays, the ultraviolet rays reach the floating gate 105 of the comparison memory element 21 in which no light-shielding member 11a is formed, and the electrons in the floating gate 105 decrease. As a result, the comparison memory element 21 changes to the state of characteristic B shown in FIG. 4.

At this time, if the gate voltage $V_G$="High" is applied to the control gate 107, the drain current increases to $I_A$. The memory element 11, however, remains in the state of characteristic A shown in FIG. 4 because the light-shielding member 11a shields irradiation of ultraviolet rays. Accordingly, in the memory element 11, the drain current remains "0" even if the gate voltage $V_G$="High" is applied to the control gate.

After that, the potential ($V_F$) of a signal line F is compared with the potential ($V_H$) of a signal line H to obtain $V_F > V_H$. Two inputs to the comparator 303 have a potential difference, and an output from the comparator 303 is inverted. That is, by inverting an output from the comparator 303, irradiation of ultraviolet rays to the semiconductor device is held as a history.

Figure 5:
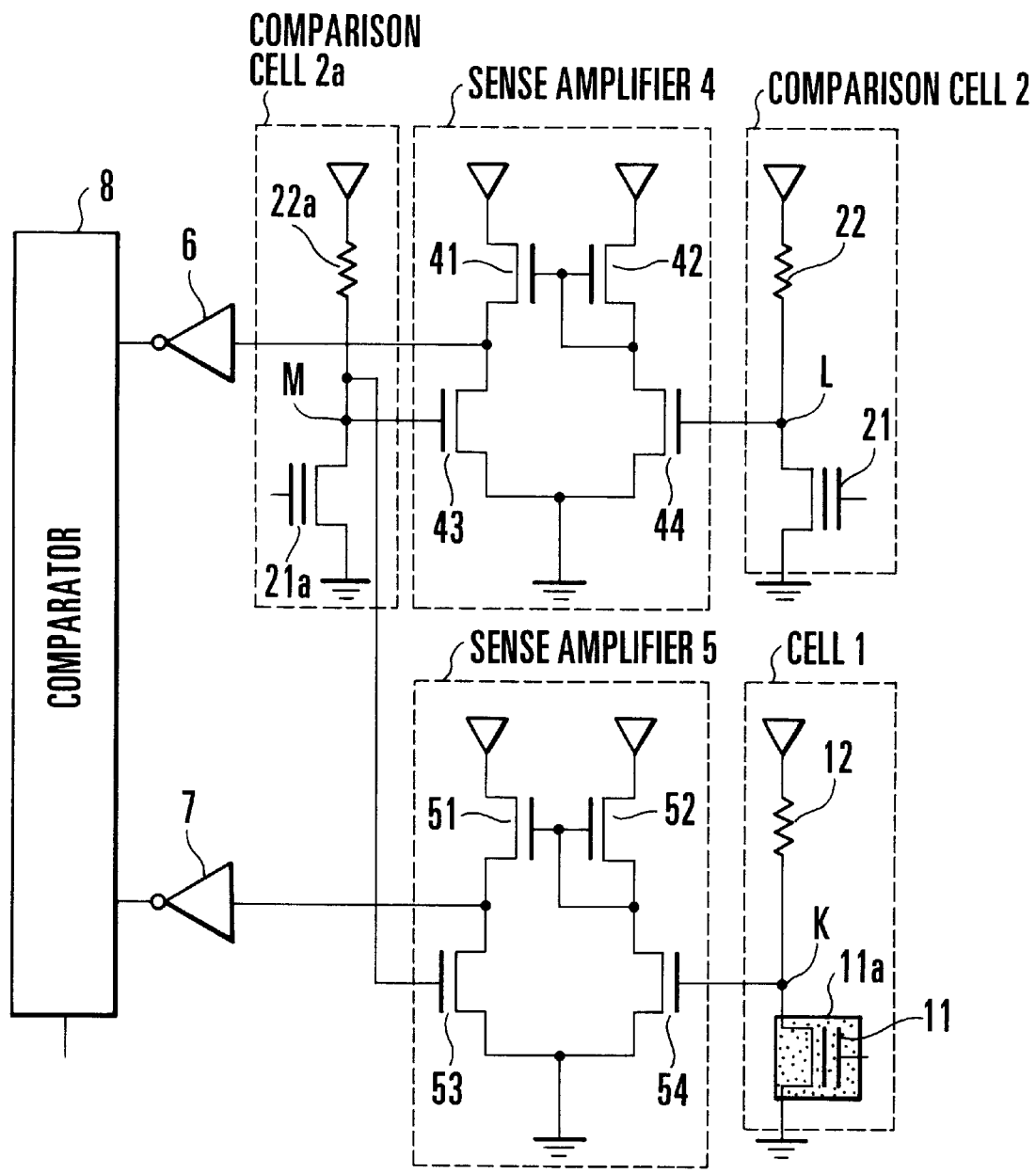
FIG. 5 is a diagram showing the schematic arrangement of a semiconductor device according to the third embodiment of the present invention.

FIG. 5 schematically shows a semiconductor device according to the third embodiment of the present invention. The same reference numerals as in FIG. 1A denote the same parts.

In the third embodiment, as shown in FIG. 5, the semiconductor device further comprises sense amplifiers 5 and 4 for amplifying outputs from a cell 1 and a comparison cell 2 and outputting the amplified outputs to a comparator (abnormality detector) 8, and a comparison cell 2a which is connected to the sense amplifiers 5 and 4 and formed on the same substrate as that of the cell 1 and the comparison cell 2. The comparison cell 2a is made up of a comparison memory element 21a and a resistor 22a connected to the drain of the comparison memory element 21a.

A resistor 12 of the cell 1 and a resistor 22 of the comparison cell 2 are set to have the same resistance values R21 and R22, and the resistor 22a of the comparison cell 2a is set to have a resistance value R22a larger than the resistance value of the resistor 22 (R22a>R21). A memory element 11 is designed to exhibit characteristic B shown in FIG. 4. The state of characteristic B is an intermediate characteristic between a nonconductive state (characteristic A shown in FIG. 4) between the source and drain, and a conductive state (characteristic D shown in FIG. 4) between the source and drain.

The sense amplifier 4 receives outputs from the comparison cells 2 and 2a, whereas the sense amplifier 5 receives outputs from the cell 1 and the comparison cell 2a. The sense amplifier 4 has a CMOS (Complementary Metal Oxide Semiconductor) structure made up of pMOS (p-channel MOS) transistors 41 and 42 and nMOS (n-channel MOS) transistors 43 and 44. Similarly, the sense amplifier 5 has a CMOS structure made up of pMOS transistors 51 and 52 and nMOS transistors 53 and 54. An output from the sense amplifier 4 is input to the comparator 8 through an inverter 6. An output from the sense amplifier 5 is input to the comparator 8 through an inverter 7.

In this arrangement, when both the comparison memory elements 21 and 21a are in a conductive state, a voltage ($V_L$) at point L and a voltage ($V_M$) at point M on the drain sides of the comparison memory elements 21 and 21a have the relation: $V_L > V_M$ because of R22a>R22. Drain currents $I_{D11}$ and $I_{D21}$ of the memory elements 11 and 21 are $I_{D11} = I_A$ and $I_{D21} = I_B$ from FIG. 4, and have the relation: $I_{D11} > I_{D21}$.

A potential at point K on the drain side of the memory element 11 is therefore higher than a potential at point L. When both the comparison memory elements 21 and 21a are in a conductive state, $V_K > V_L > V_M$ holds. On the other hand, when only the comparison memory element 21a is in a nonconductive state (characteristic A shown in FIG. 4), the potentials $V_K$, $V_L$, and $V_M$ have the relation: $V_M > V_K > V_L$.

The operation of the sense amplifiers 4 and 5 will be explained. The sense amplifiers 4 and 5 are current mirror type sense amplifier circuits generally used, and are designed to have the same characteristics.

Regarding the sense amplifier 4, the threshold voltage of the output inverter 6 is set equal to a voltage $V_N$ at point N. The voltage $V_N$ at point N is generated in voltage division by the transistors 42 and 44. Similarly, a voltage $V_O$ at point O is generated in voltage division by the transistors 41 and 43. The transistors 41 and 42, and the transistors 43 and 44 are designed to have the same characteristics.

Assume that the gate voltage $V_M$ of the transistor 43 and the gate voltage $V_L$ of the transistor 44 have the relation: $V_M > V_L$. In this case, since the ON resistances (R43 and R44) of the transistors 41 and 42 satisty R43<R44, the voltages $V_N$ and $V_O$ at points N and O have the relation: $V_N > V_O$. Since the threshold voltage of the inverter 6 is equal to $V_N$, an output I from the inverter 6 is at "High" level.

Assume that the gate voltage $V_M$ of the transistor 43 and the gate voltage $V_L$ of the transistor 44 have the relation: $V_M < V_L$. In this case, since $V_N < V_O$ holds, and the threshold voltage of the inverter 6 is equal to $V_O$, the output I from the inverter 6 is at "Low" level.

A combination of the conductive and nonconductive states of the comparison memory elements 21 and 21a will be considered. When both the comparison memory elements 21 and 21a are in a conductive state, i.e., $V_K > V_L > V_M$ is established, $V_L > V_M$ and $V_K > V_M$ hold. Therefore, both outputs I and J from the inverters 6 and 7 are at "Low" level.

When only the comparison memory element 21a is in a nonconductive state, i.e., $V_M > V_K > V_L$ is established, $V_M > V_L$ and $V_M > V_K$ hold. Therefore, both the outputs I and J from the inverters 6 and 7 are at "High" level.

In each of the memory element 11 and the comparison memory element 21a, the same voltage is applied to a control gate 107 and a drain 103 to render the source and drain nonconductive. Then, the memory element 11 changes to have characteristic B shown in FIG. 4, whereas the comparison memory element 21a changes to have characteristic A shown in FIG. 4. The comparison memory element 21 is set to the state (characteristic D in FIG. 4) wherein no electron is accumulated in the floating gate to render the source and drain conductive.

In the above state, when the semiconductor device is irradiated with ultraviolet rays, the characteristics of the memory element 11 do not change because of the presence of the light-shielding member 11a on the memory element 11. The characteristics of the comparison memory element 21 do not also change because no electron is originally accumulated in the floating gate. In other words, the memory element 11 is kept in a nonconductive state, and the comparison memory element 21 is kept in a conductive state.

In the comparison memory element 21a, however, electrons accumulated in a floating gate 105 decrease upon irradiation of ultraviolet rays to render a source 102 and the drain 103 conductive. That is, the electrical characteristic of the comparison memory element 21a changes to characteristic C shown in FIG. 4 under the influence of ultraviolet rays.

At this time, the drain currents $I_{D11}$, $I_{D21}$, and $I_{D21a}$ of the memory element 11 and the comparison memory elements 21 and 21a are $I_{D11} = I_B$, $I_{D21} = I_A$, and $I_{D21a} = I_E$. These drain currents are compared to obtain $I_{D21} > I_{D21a} > I_{D11}$. The potentials $V_K$, $V_L$, and $V_M$ of the memory element 11 and the comparison memory elements 21 and 21a on the drain side are $V_K > V_M > V_L$.

An output from the inverter 6 is at "High" level because of $V_M > V_L$, and an output from the inverter 7 is at "Low" level because of $V_K > V_M$. More specifically, an output from the inverter 6 and an output from the inverter 7 are different from each other upon irradiation of ultraviolet rays.

The outputs from the inverters 6 and 7 are input to the comparator 8, which determines whether the levels of these outputs are the same and outputs the comparison result. By monitoring the output result of the comparator 8, irradiation of ultraviolet rays can be detected.

According to the third embodiment, the sense amplifier 4 compares the magnitude of the voltage $V_L$ at point L with the magnitude of the voltage $V_M$ at point M, and the sense amplifier 5 compares the magnitude of the voltage $V_K$ at point K with the magnitude of the voltage $V_M$ at point M. The comparator 8 compares the voltage levels output from the sense amplifiers 4 and 5. Accordingly, variations in temperature characteristics of the memory element 11 and the comparison memory element 21, and the like can be canceled.

In the respective embodiments, although EPROMs are used as the memory element and the comparison memory element, the present invention is not limited to them, and floating gate type EEPROMs may be employed, as a matter of course. Using the EEPROM facilitates formation of a nonconductive state.

The material for the light-shielding member is not limited to aluminum, and another metal may be used.

As has been described above, according to the present invention, the ultraviolet irradiation states of the first and second elements become different from each other upon irradiation of ultraviolet rays. In other words, upon irradiation of ultraviolet rays, the electrical characteristics of the first and second elements become different from each other, and this difference is detected and output by the comparing means. As a result, irradiation of ultraviolet rays can be detected, and the detection results can be electrically sensed.

What is claimed is:

1. A semiconductor device comprising:

first and second elements which are formed on the same substrate, change in electrical characteristics upon irradiation of ultraviolet rays, and hold changed states, said first element having the same arrangement as an arrangement of said second element;

a light-shielding member formed on said first element to shield ultraviolet rays; and comparing means for comparing the electrical characteristics of said first and second elements and outputting an abnormality detection signal on the basis of a comparison result.

2. A device according to claim 1, wherein said first and second elements are constituted by first and second memory elements, each of said first and second memory elements comprising:

a source and drain formed in a semiconductor substrate at a predetermined interval;

a floating gate which is formed in a region sandwiched between said source and drain through a gate insulating film, and insulated from surroundings; and a control gate formed on said floating gate through an insulating film.

3. A device according to claim 2, wherein said light-shielding member is formed on said control gate of said first memory element through an insulating film in correspondence with an entire region of said floating gate.

4. A device according to claim 2, further comprising:

first and second cells constituted by said first and second memory elements.

5. A device according to claim 1, further comprising:

a first resistor series-connected to said first element between a power supply and ground; and a second resistor series-connected to said second element between said power supply and said ground and having the same resistance value as a resistance value of said first resistor, and wherein said comparing means compares a voltage signal at a connection point between said first element and said first resistor with a voltage signal at a connection point between said second element and said second resistor.

6. A device according to claim 1, further comprising:

a first resistor series-connected to said first element between a power supply and ground;

a second resistor series-connected to said second element between said power supply and said ground and having the same resistance value as a resistance value of said first resistor;

a third element and a third resistor series-connected between said power supply and said ground, said third element changing in electrical characteristics upon irradiation of ultraviolet rays and holding a changed state, and said third resistor having a resistance value larger than the resistance values of said first and second resistors;

a first sense amplifier for outputting a voltage level signal on the basis of a voltage signal at a connection point between said first element and said first resistor and a voltage signal at a connection point between said third element and said third resistor; and a second sense amplifier for outputting a voltage level signal on the basis of a voltage signal at a connection point between said second element and said second resistor and the voltage signal at the connection point between said third element and said third resistor, and wherein said comparing means compares the voltage level signals output from said first and second sense amplifiers.

7. A device according to claim 1, wherein said semiconductor device stops operating upon reception of the abnormality detection signal from said comparing means.

8. A semiconductor device, comprising:

a substrate;

a first element, formed on said substrate, said first element outputting a first signal indicative of a state thereof that is substantially unaltered in response to UV irradiation;

a second element, formed on said substrate, said second element outputting a second signal indicative of a state thereof that is altered in response to UV irradiation; and an abnormality detector, coupled to said first and second signals, said abnormality detector indicating UV irradiation of said elements.

9. A semiconductor device, according to claim 8, wherein said first element includes a light shield that renders said first element substantially unaltered in response to UV irradiation.

10. A semiconductor device, according to claim 8, wherein said abnormality detector is a comparitor.

11. A semiconductor device, according to claim 8, wherein said first and second elements are memory elements.

12. A semiconductor device, according to claim 8, further comprising:

a third element, formed on said substrate, said third element outputting a third signal indicative of a state thereof that is altered in response to UV irradiation;

a first sense amplifier, coupled to said first and third signals, said first sense amplifier providing a first logical output in response to said third signal having a value that is greater than said first signal and providing a second logical output in response to said third signal having a value that is less than said first signal; and a second sense amplifier, coupled to said second and third signals, said second sense amplifier providing the first logical output in response to said third signal having a value that is greater than said second signal and providing the second logical output in response to said third signal having a value that is less than said second signal, wherein said abnormality detector detects when logical outputs provided by said sense amplifiers are different.

13. A semiconductor device, according to claim 12, wherein said elements are memory cells each having a transistor and a resistor connected thereto and wherein resistance provided by a resistor of said third element is greater than resistance provided by resistors of said first and second elements.

14. A semiconductor device, according to claim 13, wherein transistors each include a source region, a drain region, a floating gate, and a control gate and wherein UV irradiation causes charges to escape from said floating gate.

15. A semiconductor device, according to claim 14, wherein said first element includes a light shield that inhibits light from reaching said floating gate of said transistor of said first element.

16. A method for detecting UV irradiation, comprising:

providing a first element that outputs a first signal indicative of a state that is substantially unaltered in response to UV irradiation;

providing a second element that outputs a second signal indicative of a state that is altered in response to UV irradiation; and detecting an abnormality with respect to the first and second signals.

17. A method, according to claim 16, wherein detecting an abnormality includes comparing the first and second signals.

18. A method, according to claim 16, further comprising:
providing for the first element a light shield that causes the first element to be substantially unaltered in response to UV irradiation.

19. A method, according to claim 16, further comprising:
providing a third element that outputs a third signal indicative of a state that is altered in response to UV irradiation;
providing a first sense signal that is a first logical value in response to the third signal having a value that is greater than the first signal and is a second logical value in response to the third signal having a value that is less than the first signal;
providing a second sense signal that is the first logical value in response to the third signal having a value that is greater than the second signal and is the second logical value in response to the third signal having a value that is less than the second signal; and
detecting UV irradiation according to the first and second sense signals.

20. A method, according to claim 19, wherein UV irradiation is detected when the first sense signal has a different logical value than the second sense signal.

* * * * *